(12) United States Patent
Chung et al.

(10) Patent No.: US 7,315,267 B2
(45) Date of Patent: Jan. 1, 2008

(54) MIXED-MODE SEMICONDUCTOR MEMORY

(75) Inventors: Sung-Won Chung, Busan (KR); Seung-Yoon Lee, Seoul (KR); Kyu-Ho Park, Gongju (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 11/282,239

(22) Filed: Nov. 17, 2005

(65) Prior Publication Data

US 2006/0146201 A1   Jul. 6, 2006

(30) Foreign Application Priority Data

Dec. 31, 2004   (KR) ............... 10-2004-0118123

(51) Int. Cl.
*H03M 1/66* (2006.01)
(52) U.S. Cl. .................... 341/110; 365/230.1
(58) Field of Classification Search ........... 341/155, 341/144, 82, 83, 78, 110, 165; 365/45, 185.1, 365/189.1, 230.01, 230.05
See application file for complete search history.

(56) References Cited

U.S. PATENT DOCUMENTS

| | | | | |
|---|---|---|---|---|
| 5,801,980 A | * | 9/1998 | Wong et al. | 365/45 |
| 5,815,425 A | * | 9/1998 | Wong et al. | 365/45 |
| 5,842,034 A | * | 11/1998 | Bolstad et al. | 712/11 |
| 6,144,327 A | * | 11/2000 | Distinti et al. | 341/126 |
| 6,208,542 B1 | * | 3/2001 | Wang et al. | 365/45 |
| 6,563,733 B2 | * | 5/2003 | Liu et al. | 365/185.1 |

FOREIGN PATENT DOCUMENTS

EP   1 124 230   8/2001

OTHER PUBLICATIONS

"A 700-MHz Switched-Capacitor Analog . . . ", By Haller et al., published by IEEE Journal of Solid-State Circuits, vol. 29, No. 4, Apr. 1994, pp. 500-508.
"Smart Memories: A Modular Reconfigurable Architecture", By Mai et al., published by Stamford University, 2000, pp. 161-171.
"A 10-nW 12-bit Accurate Analog Storage Cell . . . ", By O-Halloran et al., published by IEEE Journal of Solid-State Circuits, vol. 39, No. 11, Nov. 2004, pp. 1985-1996.

* cited by examiner

*Primary Examiner*—Peguy JeanPierre
(74) *Attorney, Agent, or Firm*—Bachman & LaPointe, P.C.

(57) ABSTRACT

A mixed-mode semiconductor memory includes a memory bank array, an analog/digital converter, a digital/analog converter, a plurality of digital buses and a control unit. The memory bank array includes a plurality of memory banks that are each composed of a plurality of pieces of single port memory. The analog/digital converter converts an input analog signal into digital information to store data corresponding to the input analog signal in the memory of the memory bank. The digital/analog converter converts a designated memory address of the memory bank into an analog signal to output the memory address in analog signal output form. The plurality of digital buses transmits the address and the digital information. The control unit sets the analog/digital converter and the digital/analog converter to store and output the digital information and the analog information and supplying an address signal to the memory bank. The mixed-mode semiconductor memory can store analog and digital information at a same address and output stored information in analog or digital form, as desired.

8 Claims, 4 Drawing Sheets

[Figure 1]
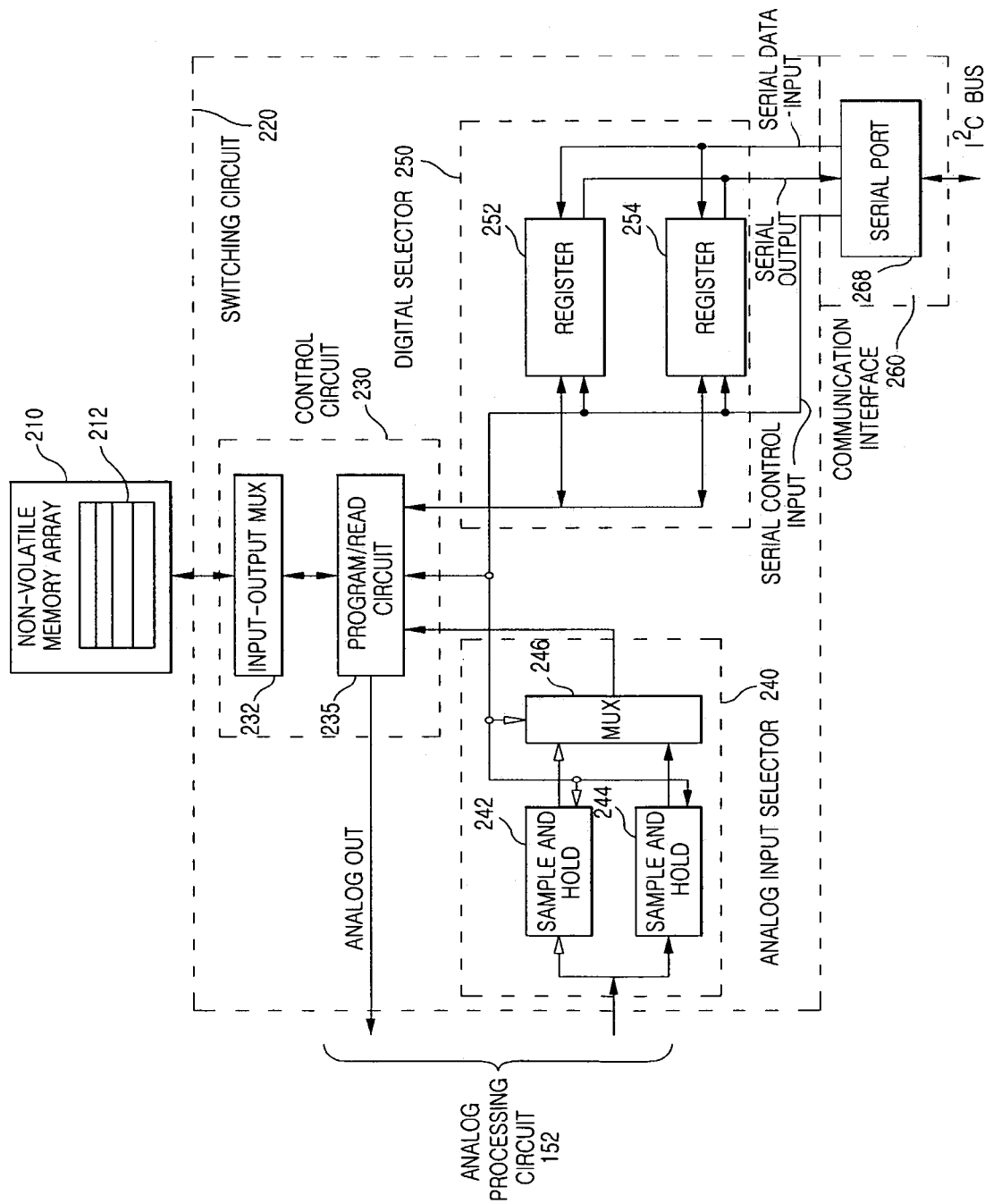

[Figure 2]
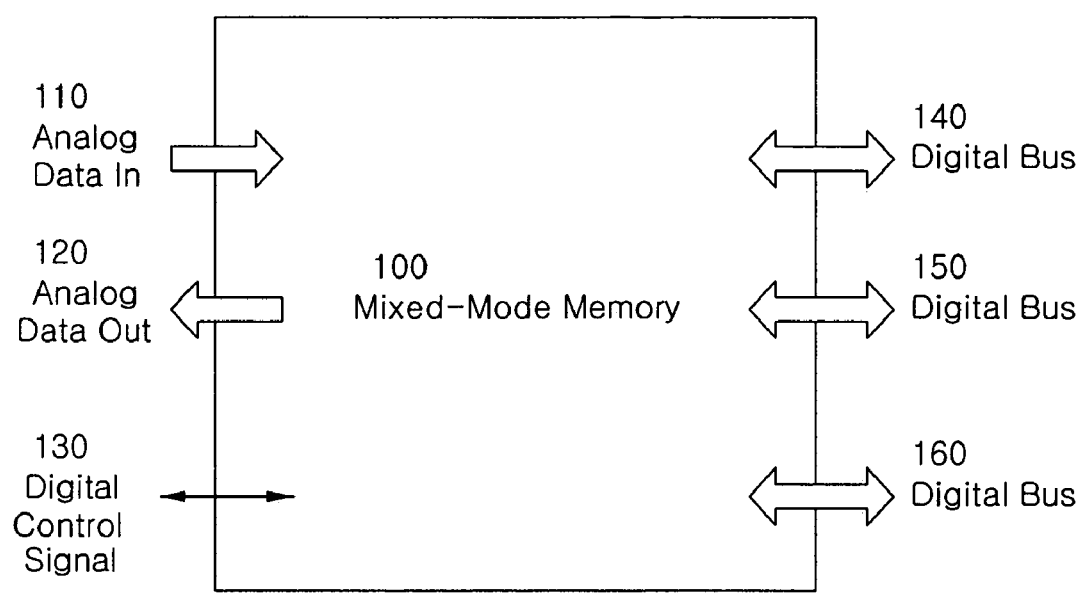

[Figure 3]
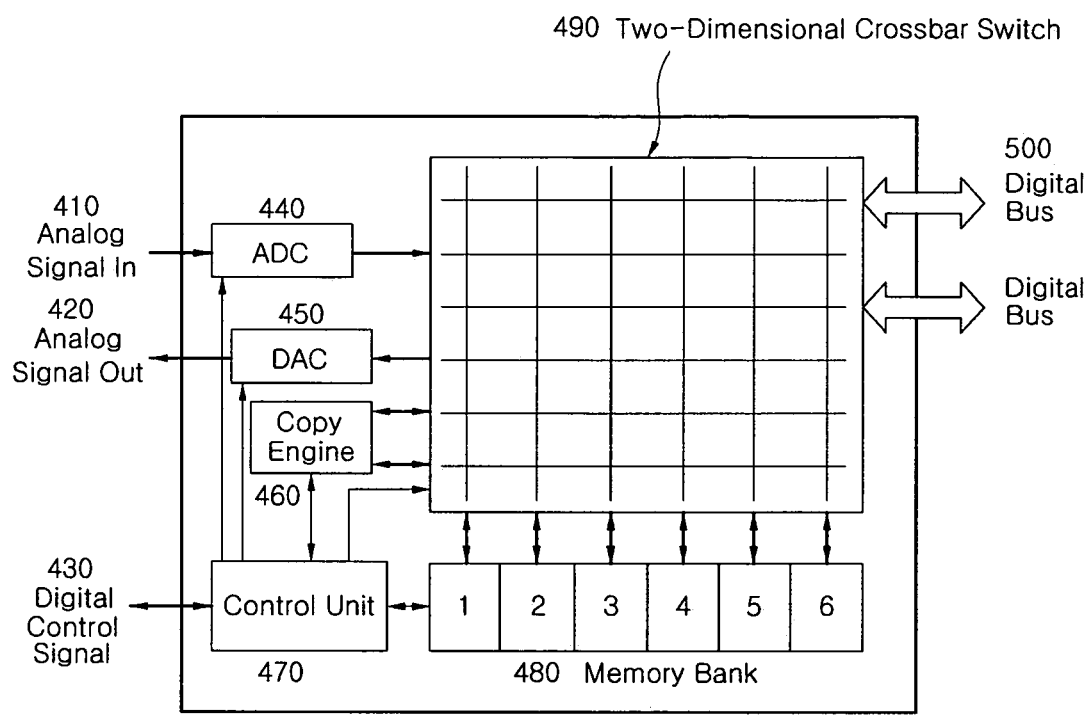

[Figure 4]
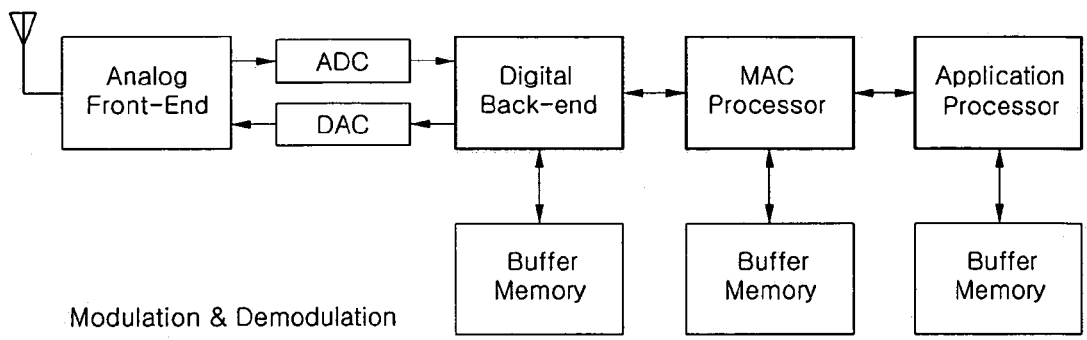
Modulation & Demodulation
[Figure 5]
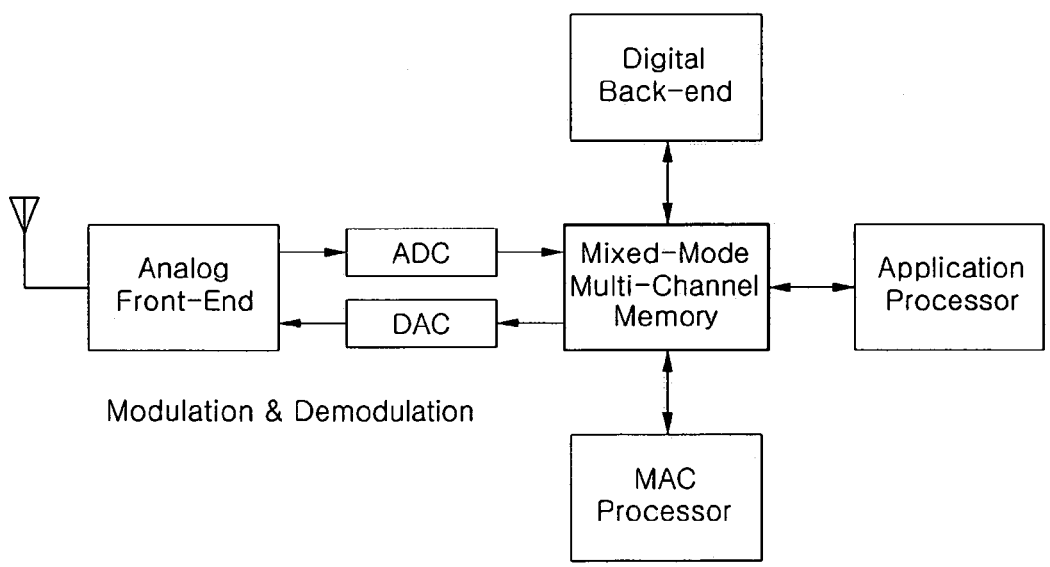
Modulation & Demodulation

MIXED-MODE SEMICONDUCTOR MEMORY

BACKGROUND OF THE INVENTION

1. Field of the Invention

The present invention relates generally to semiconductor memory and, more particularly, to mixed-mode semiconductor memory that is capable of storing both digital information and analog information.

2. Description of the Related Art

EP Pat. No. 1,124,230 of Winbond Electronics Co., entitled "A Multilevel Message Multilevel Analog Signal Recording and Playback System having Memory Array Configurable for Analog and Digital Storage and Serial Communication", that is, a prior art technology related to mixed-mode semiconductor memory, discloses a memory system that is composed of a plurality of pieces of non-volatile memory and that can implement the storage of both analog information and digital information in single memory.

FIG. 1 is a block diagram showing the construction of the memory system of the above-described patent. Each memory 212 of a non-volatile memory array 210 is configured to store one type of information, that is, analog information or digital information.

Meanwhile, prior art digital semiconductor memory can store digital information, prior art analog semiconductor memory can store analog information, and the prior art analog/digital semiconductor memory can store only analog information or digital information in a single address space.

Accordingly, in order to process analog information, which has been stored in the prior art analog memory, in a digital domain, or process digital information, which has been stored in the prior art digital memory, in an analog domain, conversion between analog information and digital information using a separate chip is required.

The conversion is problematic in that it requires an amount of time and power that are directly or exponentially proportional to the bandwidth of analog information.

SUMMARY OF THE INVENTION

Accordingly, the present invention has been made keeping in mind the above problems occurring in the prior art, and an object of the present invention is to provide mixed-mode semiconductor memory that optimizes conversion between analog information and digital information, thus reducing time and power consumption that are required for the conversion.

Another object of the present invention is to provide mixed-mode semiconductor memory that allows simultaneous access to different address spaces from different input/output interfaces, thus increasing the efficiency of use thereof.

Meanwhile, there is a difference in that prior art multi-port semiconductor memory allows simultaneous access to the same address space from different input/output interfaces while the mixed-mode semiconductor memory of the present invention does not allow such simultaneous access.

In order to accomplish the above objects, the present invention provides mixed-mode semiconductor memory, including a memory bank array comprising a plurality of memory banks that each comprise a plurality of pieces of single port memory; an analog/digital converter for converting an input analog signal into digital information to store data corresponding to the input analog signal in memory of the memory bank; a digital/analog converter for converting a designated memory address of the memory bank into an analog signal to output the memory address in analog signal output form; a plurality of digital buses for transmitting the address and the digital information; and a control unit for setting the analog/digital converter and the digital/analog converter to store and output the digital information and the analog information and supplying an address signal to the memory bank; wherein the mixed-mode semiconductor memory can store analog and digital information at a same address and output stored information in analog or digital form, as desired.

Additionally, the mixed-mode semiconductor memory further includes a two-dimensional crossbar switch for setting up connections so that the plurality of digital buses can simultaneously access an identical memory bank or different memory banks of the memory bank array, and a copy engine for copying stored data in an identical memory bank or different memory banks of the memory bank array.

BRIEF DESCRIPTION OF THE DRAWINGS

The above and other objects, features and advantages of the present invention will be more clearly understood from the following detailed description taken in conjunction with the accompanying drawings, in which:

FIG. 1 is a block diagram showing the prior art analog/digital semiconductor memory;

FIG. 2 is a block diagram showing the construction of mixed-mode semiconductor memory according to the present invention;

FIG. 3 is a block diagram showing mixed-mode semiconductor memory according to an embodiment of the present invention;

FIG. 4 is a block diagram showing the construction of a conventional high-speed mobile wireless communication terminal; and FIG. 5 is a block diagram showing the construction of a high-speed wireless communication terminal using the mixed-mode semiconductor memory according to the present invention.

DESCRIPTION OF THE PREFERRED EMBODIMENTS

Reference now should be made to the drawings, in which the same reference numerals are used throughout the different drawings to designate the same or similar components.

Preferred embodiments of the present invention are described in detail with reference to the accompanying drawings. However, the following embodiments are only presented for illustrative purposes, but the present invention is not limited to the following embodiments.

FIG. 2 is a conceptual block diagram showing mixed-mode semiconductor memory 100 according to the present invention.

As shown in FIG. 2, the mixed-mode semiconductor memory 100 according to the present invention includes a plurality of pieces of volatile or non-volatile memory. In the case where an analog signal is stored, the analog signal is converted into a digital signal and the digital signal is stored in internal memory; in the case where an analog signal is output, digital information stored in internal memory is converted into analog information and is output to the outside.

Analog signals may be stored or output on a designated block basis. For this purpose, a digital control signal includes an input signal that designates a memory block. Furthermore, the digital control signal includes information that notifies the outside of the termination of the storage in, or the output of analog signals from a designated memory block.

A digital control signal terminal 130 may receive information about the setting of the sampling rate, input signal size and number of conversion levels of an analog/digital conversion process that is used for the storage of analog signals.

The digital control signal terminal 130 may receive information about the setting of the sampling rate, input signal size and number of conversion levels of an analog/digital conversion process that is used for the output of an analog signal.

Digital buses 140, 150 and 160 allow simultaneous access to different memory addresses and transmit addresses, data and memory control signals. Digital signals are stored in memory blocks designated by digital control signals, through the digital buses 140, 150 and 160 designated by the digital control signals.

When information stored in the internal memory is output to the outside, digital signals are output from the memory blocks, which are designated by the digital control signals, to the digital buses 140, 150 and 160 that are designated by the digital control signals.

FIG. 3 is a block diagram showing mixed-mode semiconductor memory according to an embodiment of the present invention.

A memory bank array 480 having a plurality of memory banks each composed of a plurality of pieces of single port memory has an analog signal input terminal 410, an analog signal output terminal 420, and separate address and data buses for each memory bank so that multi-port digital buses 500 can gain access to the same memory bank or different memory banks of the memory bank array 480. A two-dimensional crossbar switch 490 is used to connect a plurality of digital buses to the different memory banks of the memory bank array 480.

The analog signal input terminal 410 receives an analog signal that is converted into digital information through an analog/digital converter 440 and is then stored in the memory bank of the memory bank array 480. The analog signal output terminal 420 outputs analog information into which digital information, which has been input from a memory bank of the memory bank array 480 through the two-dimensional crossbar switch 490 to the digital/analog converter 450, has been converted.

Since data copying is frequently performed in the memory, the data copying is performed between different pieces of memory of the same memory bank of the memory bank array 480 or between different pieces of memory of different memory banks of the memory bank array 480 using a separate hardware copy engine without the aid of an external processor.

The digital control signal input through the digital control signal terminal 430 controls the settings of the analog/digital converter 440, the digital/analog converter 450, the copy engine 460, the two-dimensional crossbar switch 490 and the memory bank array 480 through a control unit 470.

The sampling rate and time, resolution and input signal range of the analog/digital converter 440, the speed and operating time, resolution and output signal range of the digital/analog converter 450, the source and destination memory banks, copy start address and copy length of the copy engine 460, the source and destination memory banks, copy start address and copy length of the two-dimensional crossbar switch 490, and the on-off setting of the two-dimensional crossbar switch 490 are determined by the control unit 470.

Furthermore, when storing or outputting an analog signal, the control unit 470 selects corresponding memory of the memory bank array 480 and outputs a memory address to the address bus of the corresponding memory of the designated memory bank array 480.

When the sampling time for storing an analog signal has elapsed, the operating time for outputting an analog signal has elapsed or the operation of the copy engine 460 has terminated, the control unit 470 outputs a signal notifying the outside of the state.

Although the particular embodiment has been described in the detailed description of the present invention, various modifications are possible within a range that does not depart from the scope of the present invention. For example, by modifying the construction of the two-dimensional crossbar switch 490 of FIG. 3, the number of digital buses 500 that can be simultaneously accessed may increase. Furthermore, by modifying the construction of the memory bank array 480, parallelism can be improved.

With reference to FIGS. 4 and 5, the fact that the amount of memory copying operations can be reduced by half in the present invention is described.

FIG. 4 is a block diagram showing the construction of a conventional high-speed mobile wireless communication terminal. Wirelessly transmitted and received data undergo first and second memory copying. The first memory copying is the memory copying that occurs between the buffer memory of a digital back end and the buffer memory of a MAC processor. The second memory copying is the memory copying that occurs between the buffer memory of the MAC processor and the system memory of an application processor. The digital back end, the MAC processor and the application processor are independently designed and connected to each other through buses, so that the first and second data copying generally occur in the conventional high-speed mobile wireless communication terminal and, therefore, power consumption increases with an increase in communication speed.

FIG. 5 is a block diagram showing the construction of a novel high-speed wireless communication terminal using mixed-mode semiconductor memory according to the present invention. As described above, transmitted and received data are stored in the mixed-mode semiconductor memory of the present invention, which can store analog information or digital information at the same address. Accordingly, the receiver of the communication system stores an analog signal, which is input from an analog front end, in memory, and a digital back end, a MAC processor and an application processor can directly access the stored data. In the transmitter of the communication system, information, which is modulated in the digital back end, the MAC processor and the application processor, can also be transmitted directly from the mixed-mode semiconductor memory of the present invention to the analog front end.

When modulation and demodulation algorithms are implemented such that the digital back end and MAC processor of FIG. 5 do not simultaneously access the same memory address, the amount of memory copying that occupies the considerable part of system power and is a principle factor in determining the limitation of system performance can be decreased by half. Furthermore, in the case where modulation and demodulation algorithms and system software are designed such that the digital back end, the MAC processor and the application processor do not simultaneously access the same memory address, the high-speed mobile wireless communication terminal using the mixed-mode semiconductor memory of the present invention transmits and receives data without the above-described first and second memory copying of transmitted and received data.

As described above, the mixed-mode semiconductor memory of the present invention can store analog information or digital information at the same memory address, so that it allows a digital microprocessor to directly access an analog signal obtained from the analog front end of a communication system, thus reducing the time and energy consumption required for the conversion between analog information and digital information that are necessary for an existing system. Furthermore, the present invention has an advantage in that the amount of memory copying that generally occupies 30% of energy consumption in a communication system and is a principle factor in determining the limitation of system performance can be decreased by half.

Furthermore, the conventional multi-port semiconductor memory allows simultaneous access from different input and output interfaces to the same memory address while the mixed-mode semiconductor memory of the present invention does not allow such simultaneous access, so that the structure of memory can be simplified and, therefore, the mixed-mode semiconductor memory is economical compared to conventional multi-port memory. Furthermore, the mixed-mode semiconductor memory of the present invention has an advantage in that a multi-processor having high memory access efficiency can be supported by providing a plurality of digital buses capable of simultaneously accessing different memory addresses.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. Mixed-mode semiconductor memory, comprising:
    a memory bank array comprising a plurality of memory banks that each comprise a plurality of pieces of single port memory;
    an analog/digital converter for converting an input analog signal into digital information to store data corresponding to the input analog signal in memory of the memory bank;
    a digital/analog converter for converting digital information stored in a designated memory address of the memory bank into an analog signal to output the digital information in analog signal output form;
    a plurality of digital buses for transmitting the address and the digital information;
    a control unit for setting the analog/digital converter and the digital/analog converter to store and output the digital information and the analog information and supplying an address signal to the memory bank; and
    a two-dimensional crossbar switch for setting up connections so that the plurality of digital buses can simultaneously access an identical memory bank or different memory banks of the memory bank array
    wherein the mixed-mode semiconductor memory can store analog and digital information at a same address and output stored information in analog or digital form, as desired.

2. The mixed-mode semiconductor memory as set forth in claim 1, further comprising a copy engine for copying stored data in an identical memory bank or different memory banks of the memory bank array.

3. The mixed-mode semiconductor memory as set forth in claim 2, wherein the control unit controls the two-dimensional crossbar switch and the copy engine according to the digital control signal provided from an outside.

4. The mixed-mode semiconductor memory as set forth in claim 3, wherein the control unit generates a signal notifying the outside of a state when sampling time for storing the input analog signal has elapsed, operating time for outputting the analog signal has elapsed, or operation of the copy engine has terminated.

5. The mixed-mode semiconductor memory as set forth in claim 1, wherein the control unit performs an operation corresponding to a digital control signal designating a memory block of the memory bank and indicating starts and ends of storage and output.

6. The mixed-mode semiconductor memory as set forth in claim 5, wherein the control unit controls the analog/digital converter and the digital/analog converter according to the digital control signal that determines sampling rate and time, resolution and an input signal range of the analog/digital converter, and sampling rate and operating time, resolution and an output signal range of the digital/analog converter.

7. The mixed-mode semiconductor memory as set forth in claim 1, wherein the control unit controls the two-dimensional crossbar switch and the copy engine according to the digital control signal provided from an outside.

8. The mixed-mode semiconductor memory as set forth in claim 7, wherein the control unit generates a signal notifying the outside of a state when sampling time for storing the input analog signal has elapsed, operating time for outputting the analog signal has elapsed, or operation of the copy engine has terminated.

* * * * *